(12) United States Patent
Myers

(10) Patent No.: US 6,324,383 B1
(45) Date of Patent: Nov. 27, 2001

(54) RADIO TRANSMITTER DISTORTION REDUCING TECHNIQUES

(75) Inventor: Michael H. Myers, Poway, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/675,349

(22) Filed: Sep. 29, 2000

(51) Int. Cl.$^7$ .............................. H04B 1/10; H04B 15/00
(52) U.S. Cl. .............................. 455/63; 455/501; 375/297
(58) Field of Search ........................... 455/63, 501, 67.3, 455/127, 114, 115; 375/296, 297

(56) References Cited

U.S. PATENT DOCUMENTS

| | | | |
|---|---|---|---|
| 3,878,533 | * 4/1975 | Kleiner | 341/163 |
| 5,598,436 | * 1/1997 | Brajal | 375/297 |
| 6,141,390 | * 10/2000 | Cova | 375/297 |

* cited by examiner

*Primary Examiner*—Vivian Chang
*Assistant Examiner*—James Moore
(74) *Attorney, Agent, or Firm*—McAndrews, Held & Malloy, Ltd.

(57) ABSTRACT

The non-linearity of a power amplifier (12) and a radio frequency variable attenuator (44) are reduced by providing multiplying factors generated by a signal processor (32) and applied to the multiplying function of the attenuator (44). As a result, an input signal can be transmitted with increased accuracy which meets FAA standards for aviation radio transmission.

18 Claims, 4 Drawing Sheets

RADIO TRANSMITTER DISTORTION REDUCING TECHNIQUES

BACKGROUND OF THE INVENTION

This invention relates to reducing distortion in a radio transmitter, and more particularly relates to reducing distortion due to the non-linearity of a component in the transmitter.

The Federal Aeronautics Administration has recently authorized a new class of radio transmitters which must meet more stringent requirements than preceding transmitters. The applicant has discovered that the new FAA requirements can be more easily met if non-linearity in various transmitter components, such as a power amplifier and attenuator, are reduced. The techniques described in this specification reduce such distortion and provide techniques for facilitating the design of transmitters which meet the new FAA requirements.

BRIEF SUMMARY OF THE INVENTION

The preferred embodiment is useful for reducing distortion in a transmitter radio signal suitable for use in an aviation radio transmitter which transmits within a predetermined range of frequencies. In such an environment, the preferred embodiment comprises a component defining a first non-linear transfer function. The preferred embodiment also comprises a source of an input signal containing information to be transmitted by the radio transmitter. The input signal is used to generate a first signal including the information to be transmitted and defining a second non-linear transfer function related to the first non-linear transfer function. The first signal is preferably generated by a signal converter. The component is responsive to the first signal to reduce distortion in the transmitter radio signal.

By using the foregoing techniques, the transfer function of a radio transmitter may be linearized with a degree of economy and accuracy previously unknown.

DETAILED DESCRIPTION OF THE PREFERRED EMBODIMENTS

Figure 1:
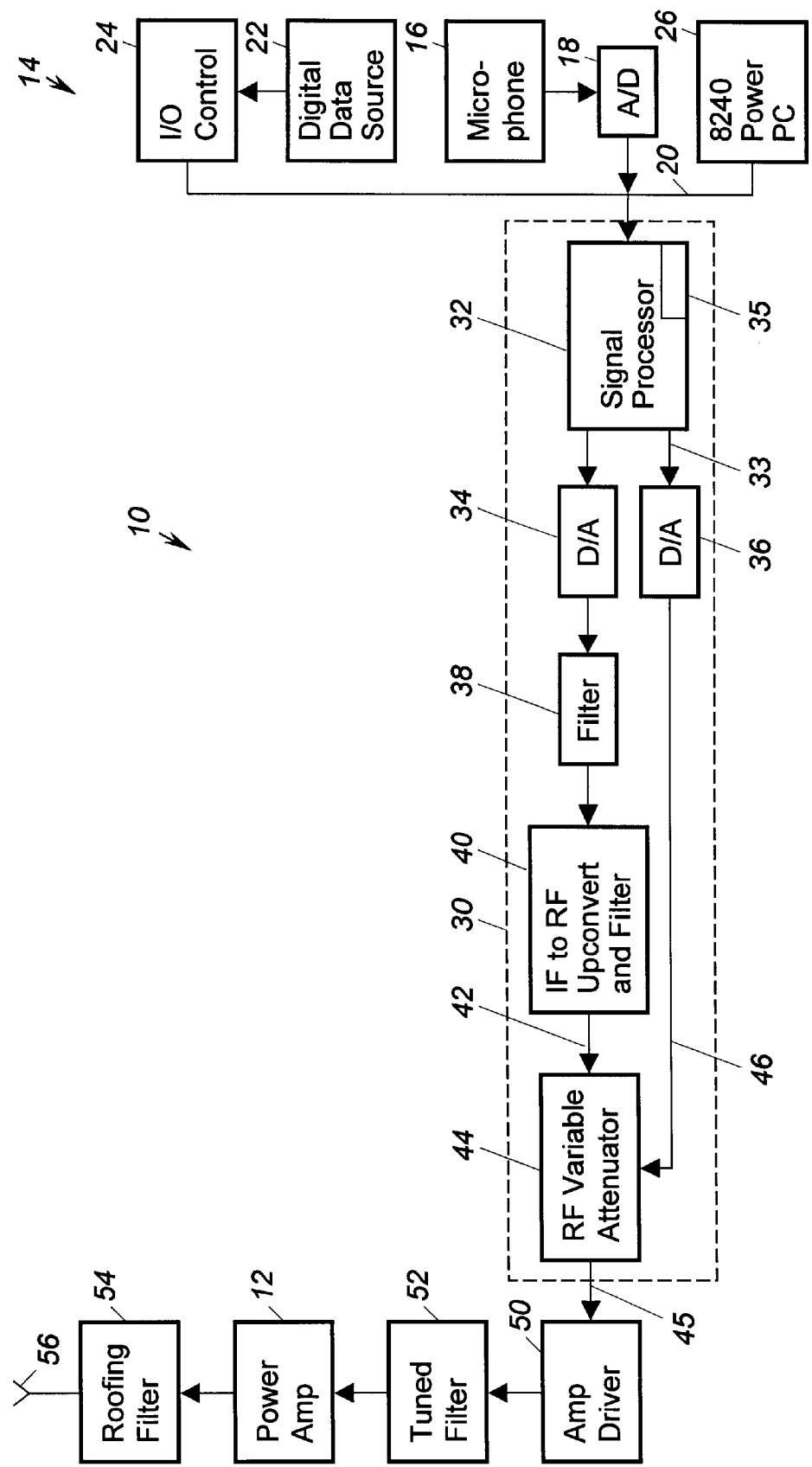
FIG. 1 is a schematic block diagram of a preferred form of the present invention.

Referring to FIG. 1, a preferred embodiment of the present invention comprises an aviation radio transmitter 10 comprising a variety of components, including a power amplifier 12 defining a non-linear transfer function. A source 14 provides an input signal containing information to be transmitted. Source 14 may provide both analog and digital information. For example, source 14 comprises an analog microphone 16 which provides an output signal to an analog to digital converter 18 that transmits the digital input signal to a computer bus 20. Source 14 also includes a digital data source 22 which provides data to an input/output control system 24 that comprises a discrete interface manager.

Voice data and amplitude modulated data are buffered by control 24 in a well known manner. Control 24 includes 16 buffers which provide 256 by 16 bits of information storage.

The data from source 22 and the digital data from A to D converter 18 also are provided to an 8240 power PC 26 which provides baseband resampling and filtering. The digital signals resulting from microphone 16 and source 22 are processed by PC 26 to make them compatible with a signal converter 30.

Converter 30 responds to the signal at its input (bus 20) to generate a signal on a conductor 45 which defines a second non-linear transfer function related to the non-linear transfer function of power amplifier 12. In general, the second non-linear transfer function defined by the signal on conductor 45 is the inverse of the non-linear transfer function of power amplifier 12. As a result, power amplifier 12 is responsive to the signal on conductor 45 to reduce the distortion in a transmitted radio signal. Converter 30 includes a field programmable gate array signal processor 32.

Signal processor 32 down converts and resamples the input data and provides filtering, as well as baseband to intermediate frequency (IF) upconverting. Processor 32 also provides transformer waveform generation and non-linear predistortion signal generation in a manner described later. Processor 32 may comprise a variety of digital processors, including a digital signal processor or a microprocessor.

A digital IF signal containing the information to be transmitted is processed by a digital to analog converter 34 and is filtered by an analog pass band filter 38 which defines a pass band between 20 KHz and 30 KHz wide. Filter 38 is designed to filter undesired side bands from the IF signal produced by digital to analog converter 34.

The output of filter 38 is transmitted at IF to radio frequency (RF) upconvert and filter circuit 40. The resulting RF signal containing the information to be transmitted is sent over a conductor 42 to an RF variable pin diode attenuator 44 designed and built by TRW. Another input to attenuator 44 is provided over a conductor 46 from a digital to analog converter 36.

At an output conductor 33, signal processor 32 generates signals representing multiplying factors related to the non-linear transfer function defined by the signal on conductor 45. Attenuator 44 acts as a multiplier to multiply the values of the signals on conductors 42 and 46 in order to generate the output on conductor 45. The signal generated on conductor 45 is transmitted to an amplifier driver 50 and then to a tuned filter 52. After being amplified by amplifier 12, the signal is passed through a roofing filter 54 and to a conventional radio transmitting antenna 56.

Signal processor 32 includes a memory or store 35 which stores coefficients defining the multiplying factors embodied in the signal appearing on conductor 33. These coefficients vary with the frequency range of the radio frequency signal being transmitted by transmitter 10.

Since amplifier 12 requires some non-linear distortion cancellation at the power levels present on Mode $0^1$ and possible Mode $A^2$ (but not Mode $2^3$) transmission, as defined by the FAA, a way of measuring and characterizing the non-linearity is needed to help reduce manufacturing and testing costs and to simplify the implementation of distortion cancellation in processor 32. I have discovered that a good fit to the radio power amplifier transfer function of typical radio amplifiers can be achieved using a hyperbolic tangent function. As a result, amplifier 12 can be completely characterized over its operating range by only two parameters as given in the nonlinear equation [1]:

$$V_{out} = a^* \tanh(b^* v) \quad [1]$$

where:

$$v \equiv \sqrt{Pin\_milliwatts}$$

This has the additional desirable effect that the inverse hyperbolic tangent is known exactly for any argument x and in fact can be expressed as the series:

$$\tanh^{-1}(x) \cong x + \frac{x^3}{3} + \frac{x^5}{5} + \frac{x^7}{7} + \ldots \quad [2]$$

In this way the predistortion function used to modify the transmit attenuation about its operating point can be written by inspection as:

$$f(a, b, vin) = a^* \left(1 + \frac{x^2}{3} + \frac{x^4}{5} + \frac{x^6}{7} + \prime\prime\prime\right) \{x = b^* v\}. \quad [3]$$

for $\{0<=x\leq 1\}$

1) DSB-AM Voice
2) DSB-AM-Data
3) D8PSK Phase Modulation

Therefore, as soon as the values of parameters a and b are determined, the inverse function is then known explicitly, and can be expressed by just a few terms of [2], since the range over which the representation is needed is strongly limited. This eliminates the work required to calculate an inverse power amplifier transfer function. Several sets of measured power amplifier transfer characteristics taken at different frequencies between 118 and 137 Mhz for amplifier 12 supports this modeling approach. What is shown next is a method for:

1. Characterizing amplifier 12 with the two given parameters (a and b).
2. An automated way of finding these parameters from measured data.
3. An immediate way of generating the inverse transfer function to be used to cancel transmitted distortion.

The measured data pairs relate the input and output voltage to the power amplifier at 64 points. In the data being processed, it is assumed that the impedance=1 ohm for simplicity to convert power curves to voltage curves. This actual impedance can be calculated by those skilled in transmitter design. The goal is to find the best set [a, b] as given in [1] to match the measured data which then allows the immediate generation of the cancellation tables needed for amplifier 12. Since equation [1] is nonlinear but continuous, a gradient controlled error minimization approach is used to solve the equation. Although good results are obtained with this approach on the computer, convergence speed is improved by deriving the expressions for non-fixed feedback gains that optimize the descent in the error power on each iteration.

With the definitions given above, an equation for the mean square error (mse) averaged over all values of input (here 64 values are given) is:

$$\overline{err^2} = \frac{1}{v \max} \int_0^{v \max} (f(v) - a^* \tanh(b^* v))^2 dv \quad [4]$$

The two dimensional gradient of the mse can be derived. From the gradient, a computer program can be constructed to iteratively solve for minimum mse and the corresponding parameters [a,b]. The two gradients can be derived as:

$$\gamma_a \equiv -2 \int_0^{v \max} err^* \tanh(bv) dv \quad [5a]$$

$$\gamma_b \equiv -2a \int_0^{v \max} v^* err^*(v)^* \sec h(bv) dv \quad [5b]$$

Figure 2:
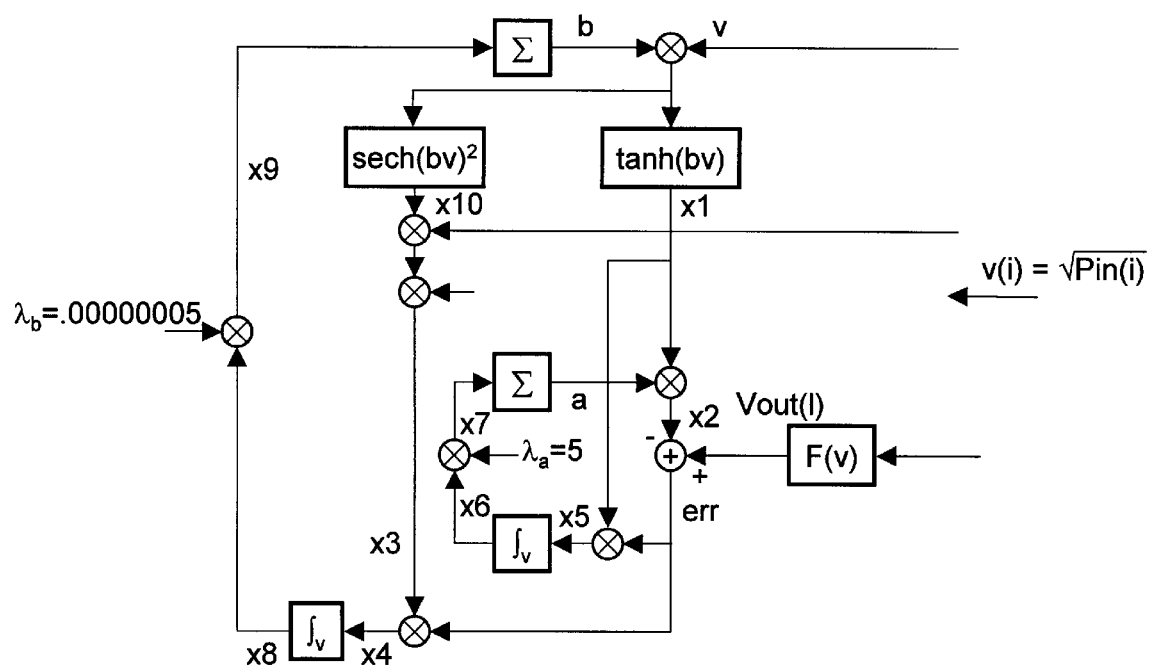
FIG. 2 is a flow diagram illustrating a computer program for finding the best fit of a hyperbolic tangent function to the transfer function of an exemplary power amplifier.

From inspection of [5a/b] a gradient descent structure can be constructed which will solve the equations as shown in FIG. 2. If desired, optimum steepest descent can be achieved by solving for the optimum gains to speed up convergence. For the feedback gain $\lambda_a$ controlling the solution in the "a" direction, the change in mse due to a step $x7 = -\lambda_a \gamma_a$ into the summer in which "a" is stored is maximized. The same is true in the "b" direction. For the "a" direction, the gain in [6] below is solved:

$$\frac{\partial}{\partial \lambda_a} \int_0^{v \max} (f(v) - (a - \lambda_a \gamma_a) \tanh(bv))^2 dv = 0 \quad [6]$$

Which gives:

$$\lambda_a = -\frac{\int_0^{vm} \gamma_a [f(v) - a \tanh(bv)^2] dv}{\int_0^{vm} \gamma_a^2 \tanh(bv)^2 dv} \quad [7\text{-a}]$$

This can be simplified by noting that the gradient is not a function of v and that the tan h<=1. Hence the gain is bounded by $$\lambda_a \leq -\frac{\int_0^{vm} err(v) dv}{\gamma_a \int_0^{vm} \tanh(bv)^2 dv} \quad [7\text{-b}]$$

Figure 3:
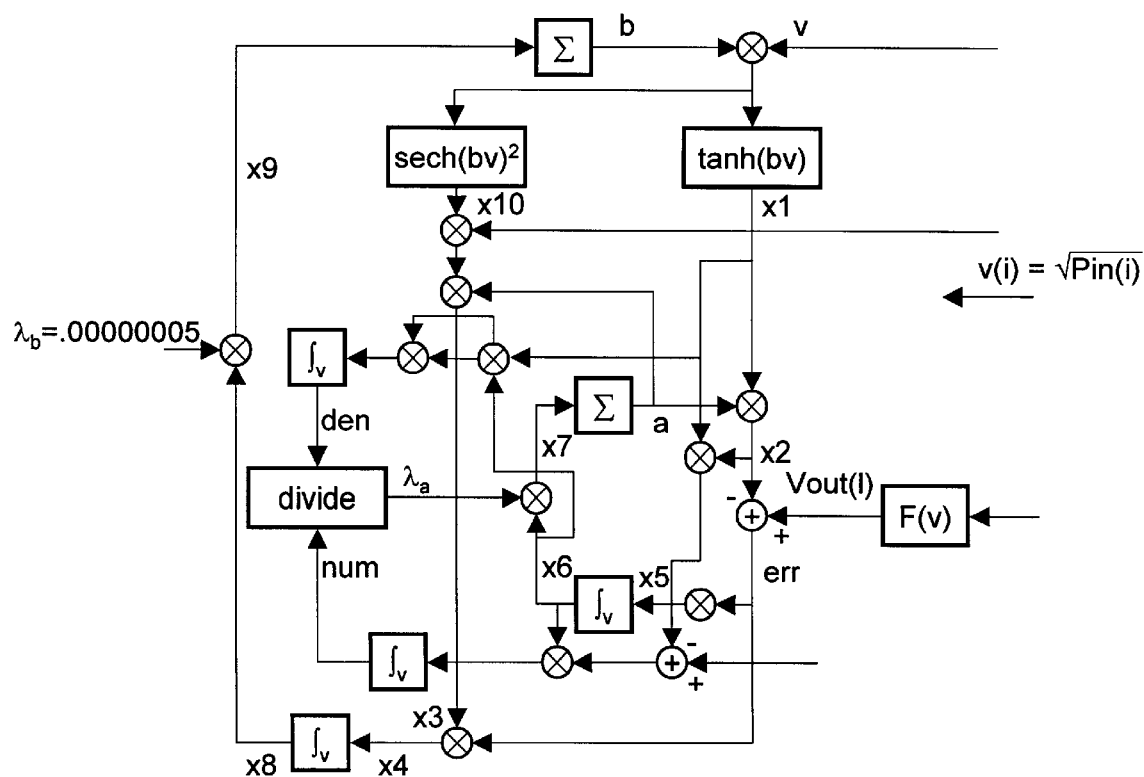
FIG. 3 is a flow diagram of an improved computer program solving for constants a and b shown in FIG. 3 with adaptive gain in the A direction.

Using [7-b] as a bound can reduce the implementation of equation [7-a] as seen in the flow diagram of FIG. 3. As described above, once the values of parameters [a,b] are found, equation [3] is used to generate the multiplying factors which are applied at a sample rate of 240 ksps to the transmit attenuator 44 on conductor 46:

$$C_i = a^* \left[1 + \frac{(b^* vin)^2}{3} + \frac{(b^* vin)^4}{5} + \frac{(b^* vin)^6}{7} + \ldots \right]. \quad [8]$$

This function is loaded at Mode 0 and A startup into an FPGA table in processor 32 for use as a lookup.

Exemplary values of parameters a and b for various transmitted frequencies are following Table A:

TABLE A

| Frequency [Mhz] | a | b |
|---|---|---|
| 118 | 436.8825 | 0.84121 |
| 123 | 476.0253 | 0.81249 |

TABLE A-continued

| Frequency [Mhz] | a | b |
|---|---|---|
| 128 | 494.7972 | 0.79766 |
| 133 | 467.7119 | 0.83079 |
| 135 | 486.3059 | 0.80158 |
| 137 | 479.877 | .80253 |

The values shown in Table A are stored in a memory 35 located in processor 32.

Figure 4:
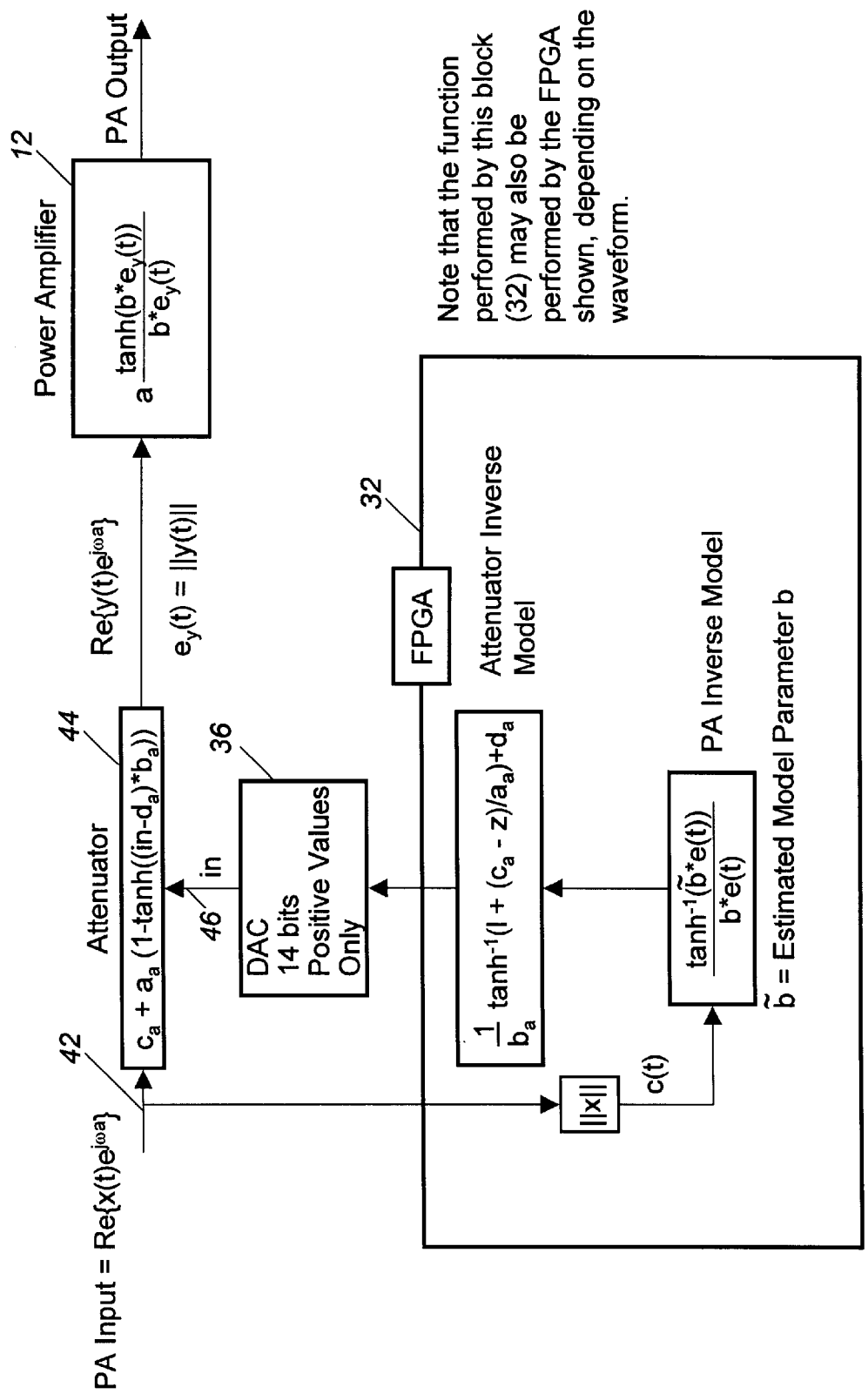
FIG. 4 is a functional block diagram of a portion of the apparatus shown in FIG. 1.

According to another embodiment of the invention, the non-linear transfer characteristic attenuator 44 is taken into account. According to this embodiment attenuator 44 also defines a non-linear transfer function which could distort the signal on conductor 45 if not corrected. As a result, the signal on conductor 46 also defines multiplying factors which enable attenuator 44 to correct for the non-linearity of the attenuator itself. FIG. 4 is a flow diagram illustrating the preferred method of accounting for both the non-linearity of power amplifier 12 and attenuator 44. As shown in FIG. 4, processor 32 uses a power amplifier (PA) inverse model and an attenuator inverse model in order to generate multiplying factors which are converted to analog form by converter 36 and transmitted over conductor 46 to attenuator 44. The attenuator multiplies the inputs from conductors 42 and 46 in the manner previously described. Attenuator 44 inherently contains a non-linear transfer function. The non-linearity is substantially reduced by using the attenuator inverse model in order to generate the multiplying factors transmitted over conductor 46.

The attenuator inverse model defines a non-linear transfer function which is the inverse of the non-linear transfer function of attenuator 44. As a result, the signals on conductor 46 adjust for the nonlinear transfer function of attenuator 44 in order to reduce distortion in the output signal. According to the alternative embodiment, both the attenuator inverse model and the power amplifier inverse model are based on a hyperbolic tangent function.

Those skilled in the art will recognize that the preferred embodiments may be altered and modified without departing from the true spirit and scope of the invention as defined in the accompanying claims:

What is claimed is:

1. Apparatus for reducing distortion in a transmitter radio signal suitable for use in an aviation radio transmitter comprising a component defining a first nonlinear transfer function, said transmitter transmitting within a predetermined range of frequencies, said apparatus comprising in combination:
   a source of an input signal containing information to be transmitted;
   a source of multiplying factors;
   a signal converter comprising an attenuator arranged to perform a multiplication function with said multiplying factors on said input signal to generate a second signal, said multiplication function containing a second nonlinear transfer function, said multiplying factors defining a third nonlinear transfer function related to said first nonlinear transfer function and a fourth nonlinear transfer function related to said second nonlinear transfer function so that said input signal is modified to adjust for said first nonlinear transfer function and said second nonlinear transfer function.

2. Apparatus, as claimed in claim 1, wherein said signal converter comprises an upconverter arranged to generate a radio frequency signal embodying said information and wherein said attenuator mulipies said multiplying factors times said radio frequency signal.

3. Apparatus, as claimed in claim 2 wherein said signal converter upconverts said input signal from baseband to an intermediate frequency (IF) signal and wherein said converter comprises an IF filter arranged to filter said IF signal.

4. Apparatus, as claimed in claim 3, wherein the IF filter is arranged to filter undesired side bands from said IF signal.

5. Apparatus, as claimed in claim 1, wherein said signal converter comprises a store arranged to store coefficients defining at least in part said multiplying factors.

6. Apparatus, as claimed in claim 5, wherein the coefficients vary with the frequencies within said predetermined range of frequencies.

7. Apparatus, as claimed in claim 1, wherein said first nonlinear function comprises a hyperbolic tangent function.

8. Apparatus, as claimed in claim 7, wherein said third nonlinear transfer function comprises an inverse hyperbolic tangent function.

9. Apparatus, an claimed in claim 1, wherein said source of an input signal comprises:
   a source of an analog signal; and
   a second converter arranged to convert said analog signal to a digital signal.

10. Apparatus, as claimed in claim 1, wherein said component comprises a power amplifier.

11. A method of reducing distortion in a transmitter radio signal suitable for use in an aviation radio transmitter comprising a component defining a first nonlinear transfer function, said transmitter transmitting within a predetermined range of frequencies, said method comprising in combination:
   receiving an input signal containing information to be transmitted;
   generating one or more first signals representing multiplying factors;
   performing an attenuating multiplication function with said multiplying factors on said input signal to generate a second signal, said multiplication function containing a second nonlinear transfer function, said multiplying factors defining a third nonlinear transfer function related to said first nonlinear transfer function and a fourth nonlinear transfer function related to said second nonlinear transfer function so that said input signal is modified to adjust for said first nonlinear transfer function and said second nonlinear transfer function; and
   passing said second signal through said component to reduce distortion in the transmitter radio signal.

12. A method, as claimed in claim 11, and further comprising upconverting said input signal to a radio frequency signal embodying said information and wherein said performing a multiplication function comprises multiplying said multiplying factors times said radio frequency signal.

13. A method, as claimed in claim 12, and further comprising:
    upconvertng said input signal from baseband to an intermediate frequency (IF) signal; and
    IF filtering said IF signal.

14. A method, as claimed in claim 13, wherein said IF filtering comprises filtering undesired side bands from said IF signal.

15. A method, as claimed in claim 11, further comprising storing coefficients defining at least in part said multiplying factors.

16. A method, as claimed in claim 15 wherein said storing coefficicents comprises storing coefficients varying with the frequencies within said predetermined range of frequencies.

17. A method, as claimed in claim 11, further comprising generating an inverse hyperbolic tangent function related to said first nonlinear transfer function.

18. A method, as claimed in claim 11, wherein said receiving comprises receiving a digital signal converted from an audio analog signal.

* * * * *